US012795858B2

(12) United States Patent
Wan et al.

(10) Patent No.: US 12,795,858 B2
(45) Date of Patent: Nov. 10, 2026

(54) IMMERSION HEAT EXCHANGE SYSTEM

(71) Applicant: Man Zai Industrial CO., LTD., Tainan City (TW)

(72) Inventors: Cheng-Chien Wan, Tainan City (TW); Cheng-Jui Wan, Tainan City (TW); Chun-Hsien Su, Tainan City (TW); Hui-Fen Huang, Tainan City (TW); Fong Jou Tu, Tainan City (TW); Chi Cheng Chen, Tainan City (TW); Chuan Meng Wang, Tainan City (TW)

(73) Assignee: MAN ZAI INDUSTRIAL CO., LTD., Tainan City (TW)

( * ) Notice: Subject to any disclaimer, the term of this patent is extended or adjusted under 35 U.S.C. 154(b) by 86 days.

(21) Appl. No.: 18/658,075

(22) Filed: May 8, 2024

(65) Prior Publication Data

US 2025/0107040 A1 Mar. 27, 2025

(30) Foreign Application Priority Data

Sep. 22, 2023 (TW) ................................ 112136329

(51) Int. Cl.
*H05K 7/20* (2006.01)

(52) U.S. Cl.
CPC ......... *H05K 7/20327* (2013.01); *H05K 7/203* (2013.01); *H05K 7/20318* (2013.01)

(58) Field of Classification Search
CPC ........................................................ H01L 23/44
See application file for complete search history.

(56) References Cited

U.S. PATENT DOCUMENTS

| | | | | |
|---|---|---|---|---|
| 2011/0056668 | A1* | 3/2011 | Taras | F28F 9/262 165/174 |
| 2011/0226456 | A1* | 9/2011 | Wan | H05K 7/20763 165/181 |
| 2015/0334880 | A1* | 11/2015 | Best | H05K 7/20836 361/679.47 |
| 2018/0279507 | A1* | 9/2018 | Midgley | H05K 7/20236 |
| 2019/0267683 | A1* | 8/2019 | Shepard | H01M 10/6554 |
| 2022/0322562 | A1* | 10/2022 | Chehade | H05K 7/20236 |
| 2024/0057286 | A1* | 2/2024 | Lin | H05K 7/20645 |

* cited by examiner

*Primary Examiner* — Paul Alvare

(57) ABSTRACT

An immersion heat exchange system includes cooling equipment and heat exchange equipment connected to the cooling equipment. The cooling equipment includes a primary container and at least one cooling tank provided in the primary container. The cooling tank holds a cooling liquid to immerse an active heat source device. The heat exchange equipment includes a secondary container and at least one heat exchange tank provided in the secondary container. The heat exchange tank is provided with at least one condenser. The condenser divides the heat exchange tank into an input portion and an output portion. At least one circulation device is associated with the input portion and/or the output portion of the heat exchange tank to circulate the cooling liquid between the cooling tank and the heat exchange tank.

10 Claims, 16 Drawing Sheets

(b)

(a)

(b)

(a)

(b)

IMMERSION HEAT EXCHANGE SYSTEM

BACKGROUND OF THE INVENTION

1. Technical Field

The present invention relates to an immersion heat exchange system and more particularly to an immersion heat exchange system with high efficiency.

2. Description of Related Art

Immersion cooling is a cooling method by which a piece of hardware equipment such as a CPU (central processing unit), a GPU (graphics processing unit), or an entire server is directly put into a dedicated liquid coolant in order to be cooled. Generally, such a liquid coolant is not electrically conductive and can absorb and transfer heat effectively without damaging the hardware being cooled. Immersion cooling is a highly efficient cooling method for high-performance computation, data centers, and mining, among other applications.

While a conventional air-cooling or water-cooling system depends on a fan or water pump to move the coolant, immersion cooling entails placing an entire hardware device into a cooling liquid to form direct contact between the hardware device and the cooling liquid and thereby increase the efficiency of heat transfer. Immersion cooling has the following advantages: 1. High efficiency: Highly efficient heat transfer is generally achievable through direct contact. 2. Highly efficient use of space: Since there is no need to use an additional fan or cooling tower, space can be utilized more efficiently. 3. Low noise: The absence of a rotating fan or water pump contributes to a quiet cooling operation. 4. Potentially low maintenance cost: A reduction in maintenance cost is possible because there is no heat dissipater or fan that needs frequent cleaning or replacement.

Immersion cooling, however, has its deficiencies and challenges, including those associated with the choice of liquid coolant, cost, and the necessary hardware and software adjustments. Nevertheless, immersion cooling remains a highly effective cooling solution for certain high-performance applications.

An immersion cooling product typically uses a plate heat exchanger for cooling. Although a plate heat exchanger occupies a relatively small space, the high viscosity coefficient of the cooling liquid gives rise to relatively high impedance, and hence a relatively poor condensation effect (a plate heat exchanger exchanges heat between water and a cooling liquid that circulate through alternate gaps between plates), which results in a loss in heat exchange efficiency.

BRIEF SUMMARY OF THE INVENTION

The primary objective of the present invention is to provide an immersion heat exchange system comprising cooling equipment and heat exchange equipment. The cooling equipment comprises a primary container and at least one cooling tank provided in the primary container, wherein the cooling tank holds a cooling liquid in order for an active heat source device to be immersed in the cooling liquid. The heat exchange equipment connected to the cooling equipment comprises a secondary container and at least one heat exchange tank provided in the secondary container, wherein the heat exchange tank is provided therein with at least one condenser, and the condenser divides the heat exchange tank into an input portion and an output portion, with at least one circulation device corresponding to and working with the input portion and/or the output portion of the heat exchange tank to make the cooling liquid exchanged and circulated between the cooling tank and the heat exchange tank.

Furthermore, the circulation device draws the cooling liquid in the cooling tank and forces the drawn cooling liquid into the heat exchange tank, and the output portion of the heat exchange tank is in communication with the cooling tank to enable circulation.

Furthermore, the secondary container comprises: a secondary container body having the heat exchange tank, a collection opening provided on an upper side of the secondary container body, and a communication opening provided on a lower side of the secondary container body and communicating with the cooling tank.

Furthermore, the collection opening is provided therein with a separation plate covering the condenser from above, the separation plate is provided with a least one through hole to allow passage of the cooling liquid, and the through hole is aligned with a side of the condenser that faces the input portion.

Furthermore, the condenser comprises a first main-channel tube connected to a heat dissipation device, a plurality of flat tubes each having one end connected to the first main-channel tube to allow passage of a thermal conduction medium, and a second main-channel tube connected to an opposite end of each of the flat tubes. The cooling liquid having entered the heat exchange tank exchanges heat with the thermal conduction medium in the flat tubes through the flat tubes such that a temperature of the cooling liquid is reduced while a temperature of the thermal conduction medium is increased, and the second main-channel tube is connected to the heat dissipation device in order to deliver the thermal conduction medium whose temperature has been increased to the heat dissipation device to complete circulation of the thermal conduction medium.

Furthermore, there are a plurality of said condensers, and the condensers are connected in series.

Furthermore, the first main-channel tube of each of the condensers is connected to the same heat dissipation device, and the second main-channel tube of each of the condensers is connected to the same heat dissipation device.

Furthermore, the first main-channel tube of at least one of the condensers is connected to the second main-channel tube of another said condenser.

Furthermore, the second main-channel tube of at least one of the condensers is connected to the second main-channel tube of another said condenser.

Furthermore, the first main-channel tube of a said condenser adjacent to the output portion is connected to the heat dissipation device.

Furthermore, a booster pump is provided between the condenser and the heat dissipation device, and the booster pump forces the thermal conduction medium into the tubes of the condenser to enable circulation.

Furthermore, the circulation device is a pump for drawing the cooling liquid in the cooling tank to the heat exchange tank.

The present invention uses a condenser to cool a cooling liquid directly, lest the high viscosity coefficient of the cooling liquid cause a loss in heat exchange efficiency. The invention has such advantages over the prior art as high efficiency, high fault tolerance, and ease of maintenance.

DETAILED DESCRIPTION OF THE INVENTION

The details and technical solution of the present invention are hereunder described with reference to accompanying drawings. For illustrative sake, the accompanying drawings are not drawn to scale. The accompanying drawings and the scale thereof are not restrictive of the present invention.

As used herein, the term "one side" of an object may refer to, without limitation, an upper side, a lower side, a left side, a right side, a front side, or a rear side of the object; a position adjacent to the object; or a position in relation to, and resulting from direct or indirect connection with, the object.

Figure 1:
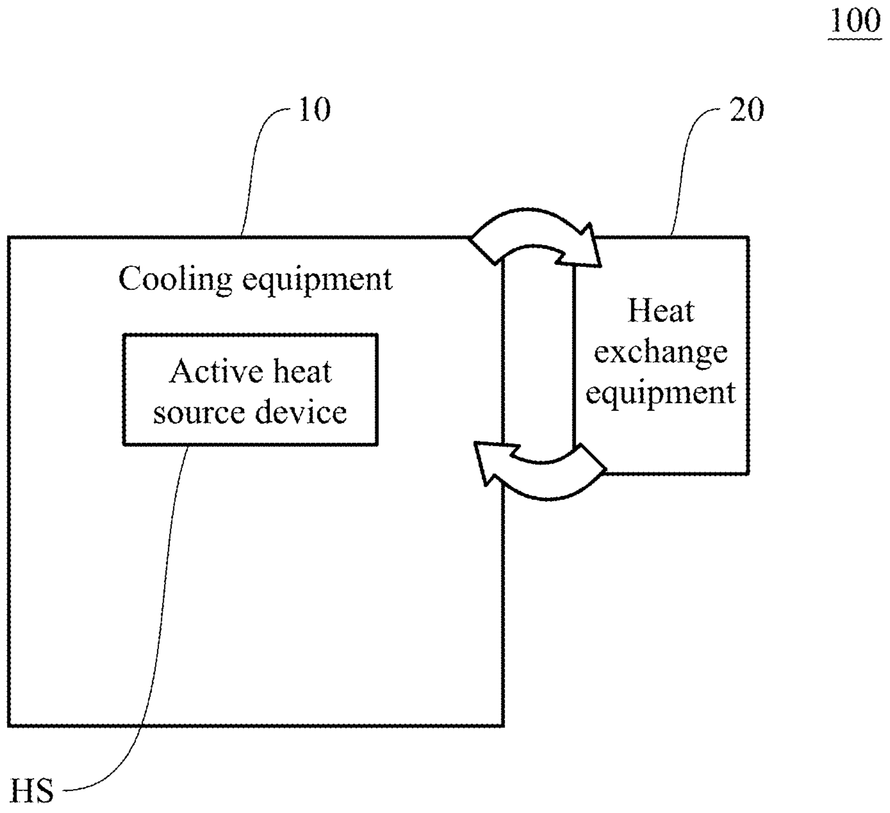
FIG. 1 is a block diagram of an immersion heat exchange system according to the present invention.

The present invention is described below with reference to specific embodiments. The embodiments serve only to enable a clear understanding of the contents of the invention and are not intended to be restrictive of the scope of the invention. Please refer to FIG. 1 for a block diagram of an immersion heat exchange system according to the invention. As shown in the drawing, the illustrated embodiment provides an immersion heat exchange system 100 that essentially includes cooling equipment 10 and heat exchange equipment 20 connected to the cooling equipment 10. The cooling equipment 10 is where an active heat source device HS is placed, and where the active heat source device HS is immersed in a non-conductive cooling liquid to increase heat transfer efficiency. The heat exchange equipment 20 is provided on one side of the cooling equipment 10. The cooling liquid is introduced into the heat exchange equipment 20 in order to be cooled through exchange of heat, and the cooled cooling liquid is circulated back to the cooling equipment 10 to complete a heat exchange cycle. In one embodiment, the cooling liquid may include, but is not limited to, a silicone oil, a white mineral oil, a synthetic organic liquid, an alkylated aromatic, a fluorocarbon, a polyalphaolefin, a polyalkylene glycol, or any other cooling liquid; the invention has no limitation in this regard.

Figure 2:
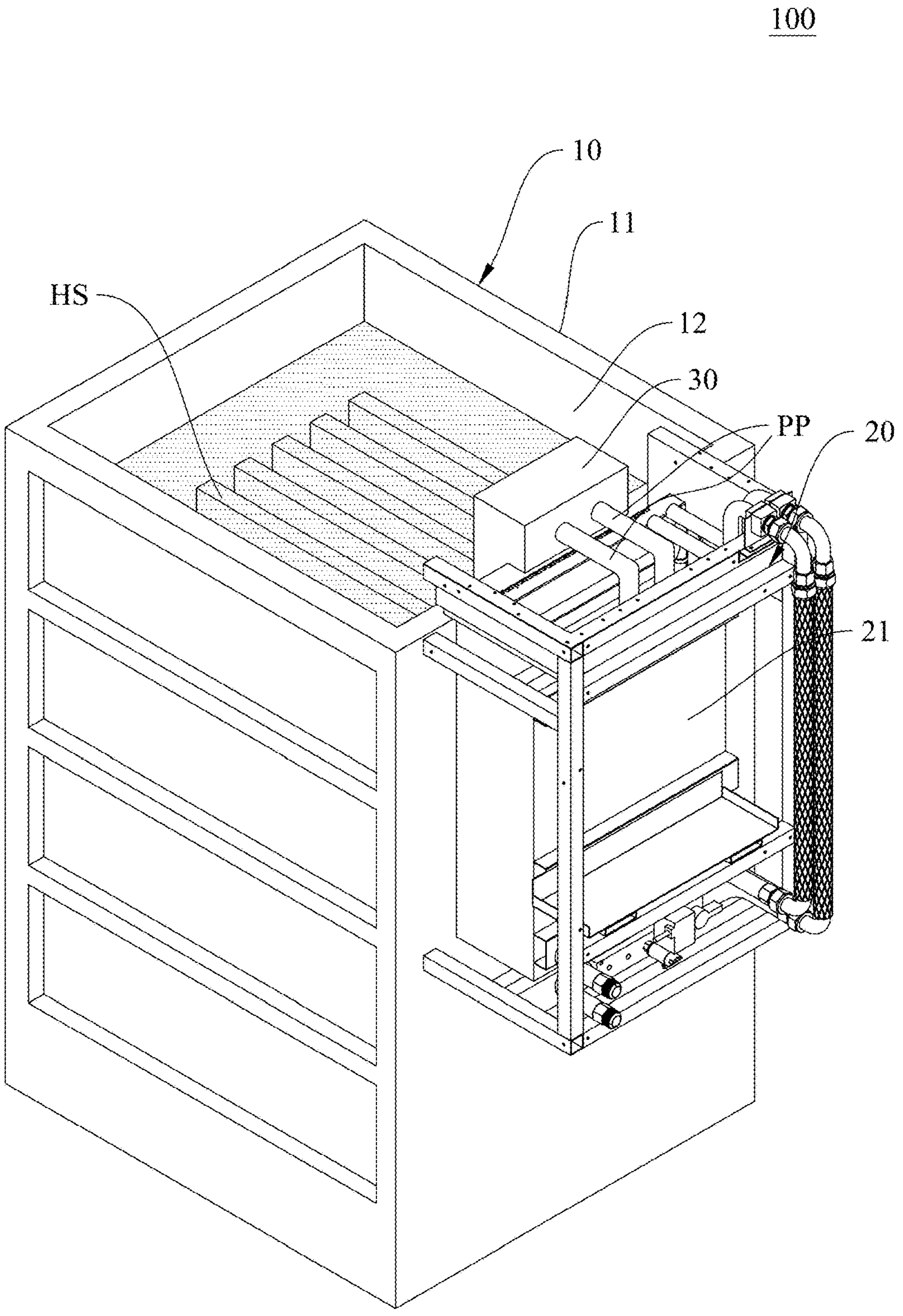
FIG. 2 is a perspective view of an immersion heat exchange system according to the present invention.

The structure of the cooling equipment is detailed below with reference to FIG. 2, FIG. 3, and FIG. 4, which are a perspective view of an immersion heat exchange system according to the present invention, a perspective view of heat exchange equipment according to the invention, and a sectional view taken along line AA' in FIG. 3, respectively. As shown in the drawings, the cooling equipment 10 essentially includes a primary container 11 and at least one cooling tank 12 provided in the primary container 11. The cooling tank 12 holds the cooling liquid in which the active heat source device HS is immersed. In one embodiment, there is only one cooling tank 12, and the single cooling tank 12 may accommodate one or a plurality of active heat source devices HS. In another embodiment, there may be a plurality of cooling tanks 12 each accommodating a corresponding active heat source device (e.g., a server board or a motherboard). The provision of a plurality of cooling tanks (not shown) makes it possible to separate individual active heat source devices, thereby simplifying the maintenance and management of hardware and enabling more effective management of individual hot areas. The invention has no limitation on the number of the at least one cooling tank.

The heat exchange equipment 20 includes a secondary container 21 and at least one heat exchange tank 22 provided in the secondary container 21. The heat exchange tank 22 is provided therein with one or a plurality of condensers 23, which divide the heat exchange tank 22 into an input portion IP and an output portion OP. To deliver the cooling liquid in the cooling equipment 10 to the heat exchange equipment 20 for heat exchange, the cooling equipment 10 is provided with at least one circulation device 30 corresponding to, and configured to work with, the input portion IP of the heat exchange tank 22 so that the cooling liquid can be exchanged and circulated between the cooling tank 12 and the heat exchange tank 22. Please note that the "condenser" referred to herein is not used for condensation but is used to realize exchange of heat through the condenser structure. More specifically, the at least one condenser in the present invention works in such a way that a relatively low-temperature thermal conduction medium is input into the tubes of the condenser to exchange heat with, and thereby lower the temperature of, the relatively high-temperature cooling liquid passing through the condenser. In one embodiment, the thermal conduction medium may be, for example but not limited to, water, a refrigerant, or another similar material; the invention has no limitation in this regard.

Figure 4:
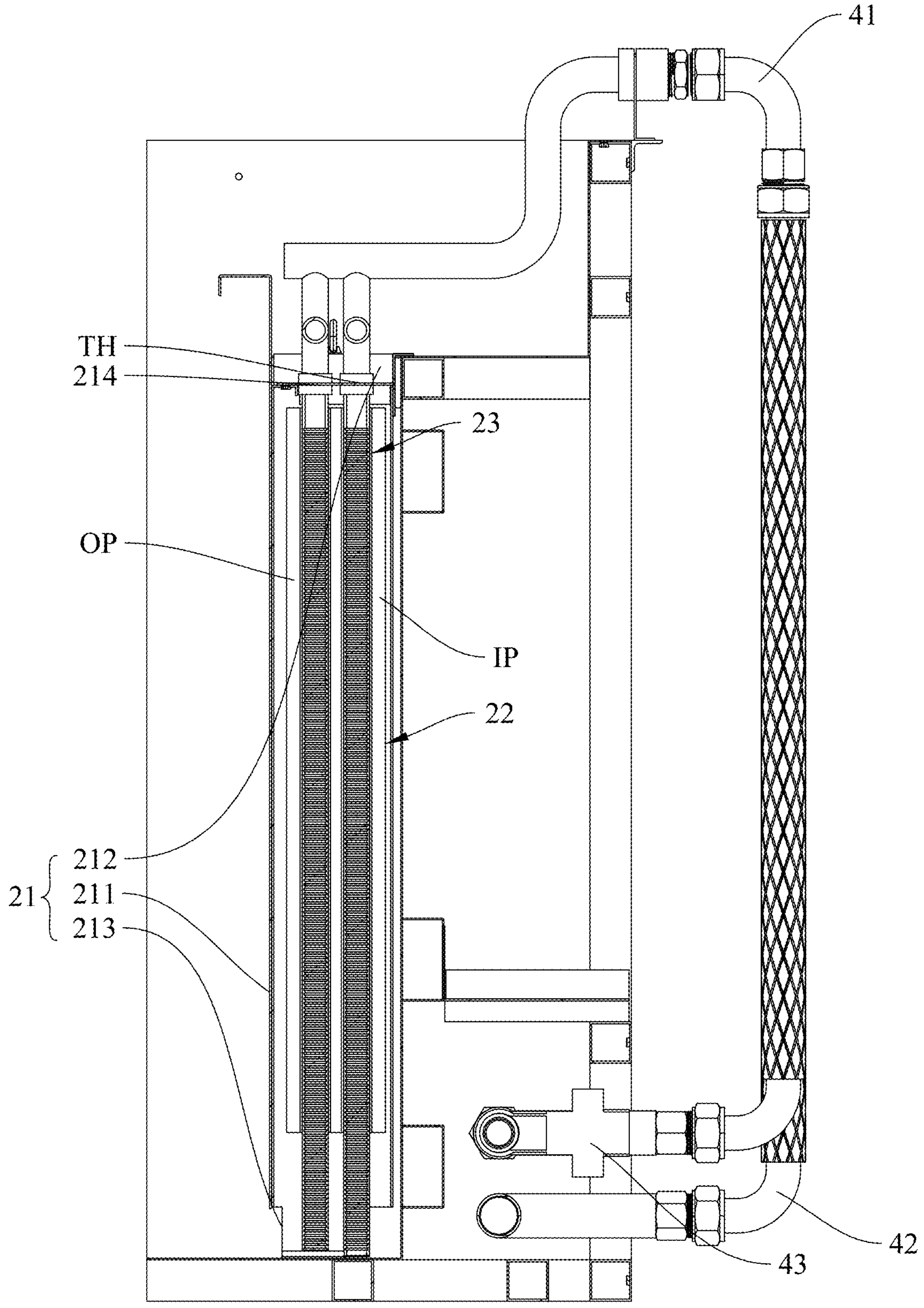
FIG. 4 is a sectional view taken along line AA' in FIG. 3.

In one embodiment, referring to FIG. 4, the circulation device 30 (see FIG. 2) may be configured to draw the cooling liquid in the cooling tank 12 and force the drawn cooling liquid into the heat exchange tank 22, with the output portion OP of the heat exchange tank 22 in communication with the cooling tank 12 to enable circulation. In one embodiment, the secondary container 21 includes a secondary container body 211 having the heat exchange tank 22, a collection opening 212 provided on an upper side of the secondary container body 211, and a communication opening 213 provided on a lower side of the secondary container body 211 and communicating with the cooling tank 12. In one embodiment, the circulation device 30 is a pump for drawing the cooling liquid in the cooling tank 12 to the heat exchange tank 22; the present invention, however, has no limitation on the type of the circulation device 30.

In the illustrated embodiment, the circulation device 30 is configured to deliver the cooling liquid in the cooling tank 12 to the input portion IP of the heat exchange tank 22, and the return flow is formed simply by allowing the cooling liquid to flow back to the cooling tank 12 through the communication opening 213. In a feasible embodiment, however, the circulation device 30 may be used to deliver the cooling liquid from the output portion OP of the heat exchange tank 22 to the cooling tank 12 while the cooling liquid in the cooling tank 12 flows directly into the input portion IP by way of circulation. The present invention has no limitation on how the circulation device 30 circulates the cooling liquid between the cooling tank 12 and the heat exchange tank 22. In another embodiment, the cooling tank 12 may be provided with a circulation device corresponding to the input portion IP of the heat exchange tank 22 and another circulation device corresponding to the output portion OP of the heat exchange tank 22 to enhance circulation efficiency. The invention has no limitation on variations such as those of the foregoing embodiments.

To prevent foreign matter in the air (e.g., dust) from entering the heat exchange tank 22 and thus increasing the viscosity of the cooling liquid, the collection opening 212 is provided with a separation plate 214 that covers the at least one condenser 23 from above. The separation plate 214 is provided with at least one through hole TH to enable connection with the at least one pipe PP of the circulation device 30 so that the circulation device 30 can deliver the cooling liquid into the input portion IP of the heat exchange tank 22 through the through hole TH directly by way of the pipe PP connected to the through hole TH. Moreover, the through hole TH is aligned with the side of the condenser 23 that faces the input portion IP, in order for the cooling liquid passing through the through hole TH to enter the input portion IP first. The closed pipe PP can effectively improve the prior art problem associated with the viscosity of the cooling liquid. In one embodiment, the circulation device 30 may be provided with at least one motor corresponding in number to the at least one through hole TH, and in cases where a plurality of motors are provided, the failure of a single motor will not cause failure of the entire cooling system. The present invention has no limitation on the number of the at least one through hole TH of the separation plate 214.

Figure 5:
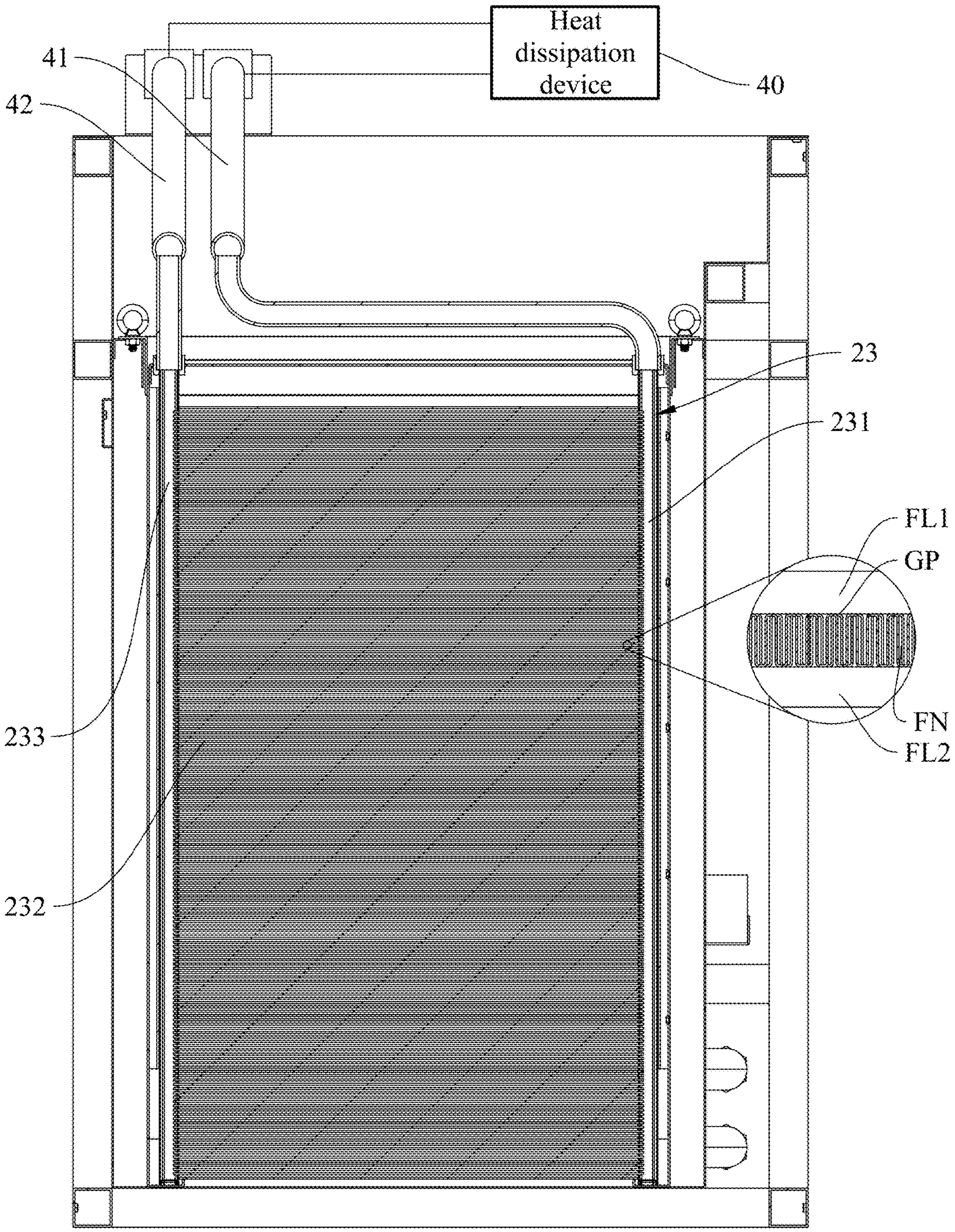
FIG. 5 is a sectional view taken along line BB' in FIG. 3 and corresponding to the first embodiment.

The structure of the condenser 23 is detailed below with reference to FIG. 5 and FIG. 6, which are a sectional view taken along line BB' in FIG. 3 and corresponding to the first embodiment and a perspective view of offset fins according to the present invention, respectively. As shown in the drawings, each condenser 23 in this embodiment essentially includes a first main-channel tube 231, a plurality of flat tubes 232 each connected at one end to the first main-channel tube 231, and a second main-channel tube 233 connected to the other end of each flat tube 232. After entering the heat exchange tank 22, the cooling liquid exchanges heat with the thermal conduction medium in the flat tubes 232 through the flat tubes 232 and is thus cooled by the thermal conduction medium. To input a (relatively) low-temperature thermal conduction medium into the condensers 23, the condensers 23 may be further connected to a heat dissipation device 40. The heat dissipation device 40 may be, for example, an evaporator, an expansion valve, a cooling tower, a fan cooler, a heat exchanger, or another similar device; the invention has no limitation in this regard.

The first main-channel tube 231 of each condenser 23 may be connected to the low-temperature thermal conduction medium output unit 41 of the heat dissipation device 40 in order to receive the relatively low-temperature thermal conduction medium. The second main-channel tube 233 of each condenser 23 may be connected to the high-temperature thermal conduction medium input unit 42 of the heat dissipation device 40 in order to input the heated thermal conduction medium into the heat dissipation device 40 and thereby lower the temperature of the thermal conduction medium to complete one circulation of the thermal conduction medium. In one embodiment, a heat dissipation fin FN may be provided in the gap between each two adjacent flat tubes 232 (e.g., the gap GP between each adjacent pair of upper flat tube FL1 and lower flat tube FL2 in FIG. 5 and FIG. 6), the objective being to enhance heat dissipation efficiency. The channels formed by the heat dissipation fins FN may extend in a direction parallel to the gap between each two adjacent flat tubes 232 to reduce resistance to passage of the cooling liquid. In a further embodiment, the heat dissipation fins FN may be offset fins for example; the invention, however, has no limitation on the configuration of the heat dissipation fins FN.

Figure 6:
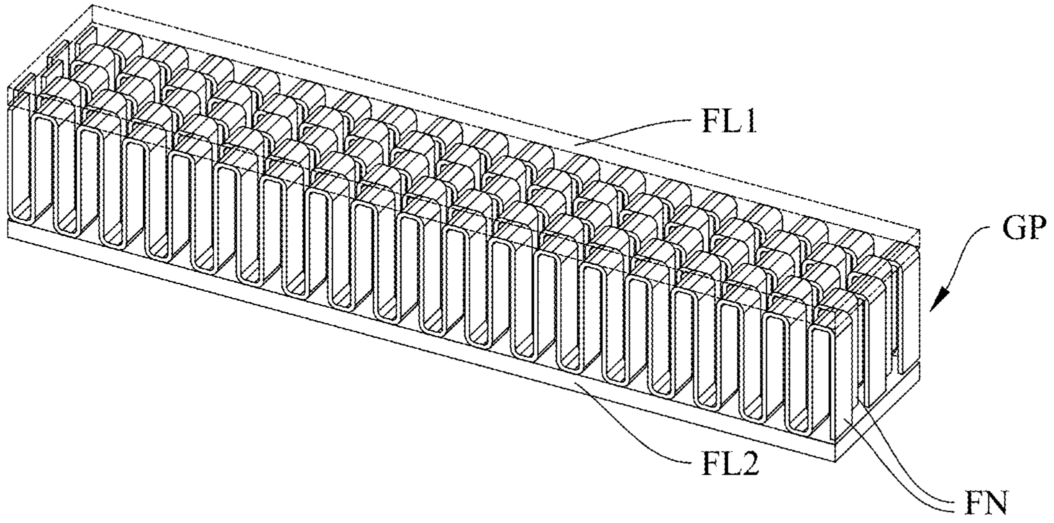
FIG. 6 is a perspective view of offset fins according to the present invention.

"Offset fins" refers to a plurality of rows of undulated fins in which the bends of the fin in each row are laterally offset from those in the next row in an alternating manner (as shown in FIG. 6) such that the generally central, i.e., aligned, portions of the spaces in the bends form main channels through which the cooling liquid can flow while the lateral portions of the main channels form a plurality of staggered structures that can disturb the cooling liquid (i.e., liquid-state heat dissipation medium) to reduce the speed at which the cooling liquid flows through the fins, thereby increasing the time of contact between the cooling liquid and the fins and hence the efficiency with which the cooling liquid carries heat away, the goal being to provide effective cooling.

In one embodiment, each flat tube 232 is provided therein with a plurality of dividing walls (not shown) to divide the interior of the flat tube 232 into a plurality of capillaries (not shown), thereby enhancing the efficiency of heat transfer from the thermal conduction medium to the flat tubes 232. In one embodiment, a booster pump 43 is provided between the condensers 23 and the heat dissipation device 40 to force the thermal conduction medium into the tubes of the condensers 23 so that the thermal conduction medium is forced to circulate through the condensers 23 and the heat dissipation device 40.

To raise the heat exchange efficiency, the number of the at least one condenser 23 in this embodiment is two, and the two condensers 23 are connected in series. The term "connected in series" refers to a connection arrangement in which the cooling liquid input portion of one of the two condensers faces and is connected to the cooling liquid output portion of the other condenser so that the cooling liquid can pass through the two condensers sequentially in order to be cooled twice. In another embodiment, the number of the at least one condenser 23 may be one, or there may be three or more condensers 23 connected in series; the present invention has no limitation on the number of the at least one condenser 23.

Figure 7:
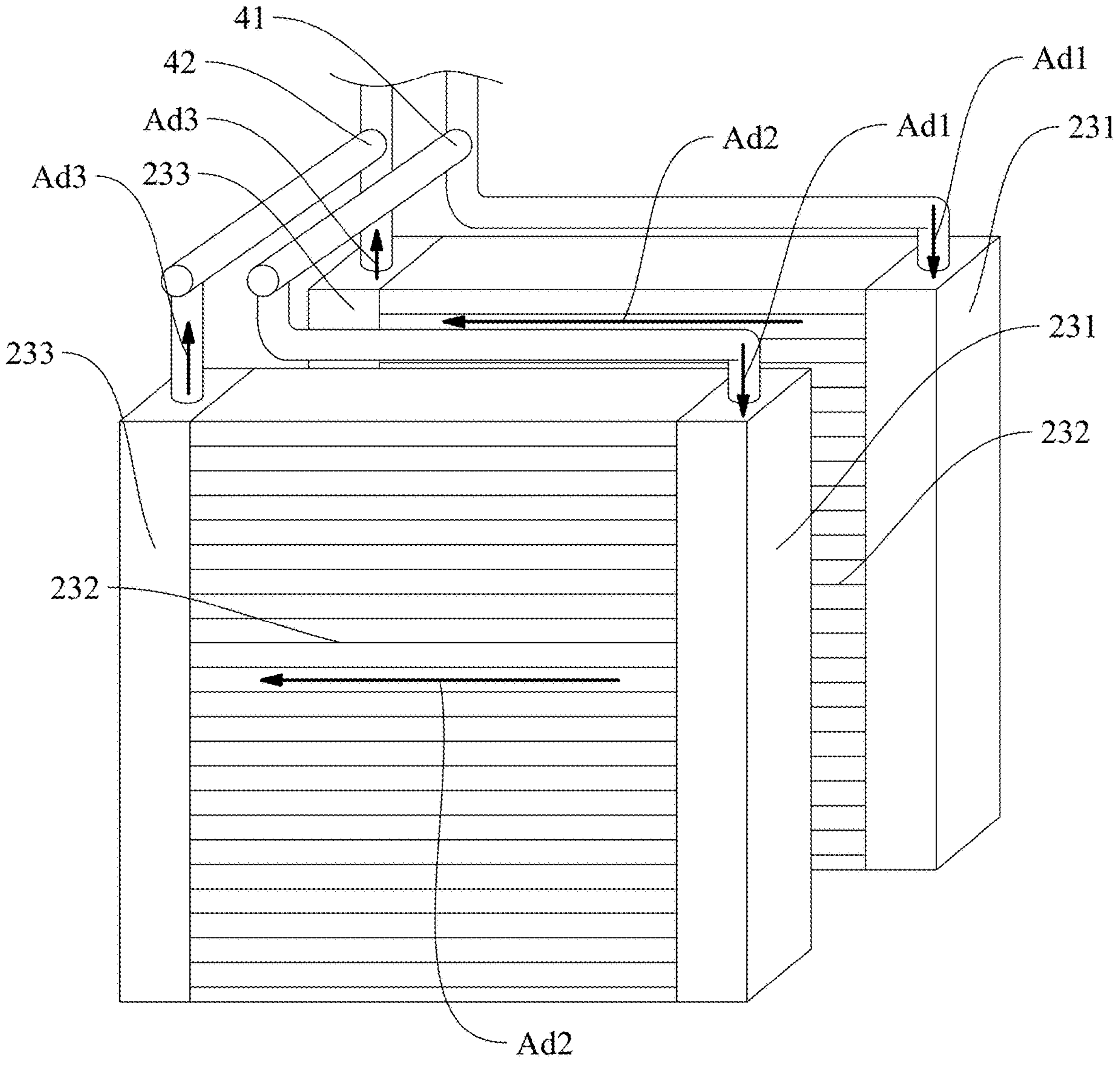
FIG. 7 schematically shows the loop design of one of a plurality of condenser embodiments according to the present invention.

The loop design of the embodiment shown in FIG. 2 to FIG. 5 is described below with reference to FIG. 7, which schematically shows the loop design of one of a plurality of condenser embodiments according to the present invention. As shown in FIG. 7, there are a plurality of condensers 23. The first main-channel tubes 231 of the condensers 23 may be connected to the low-temperature thermal conduction medium output unit 41 of a single heat dissipation device 40, and the second main-channel tubes 233 of the condensers 23 may be connected to the high-temperature thermal conduction medium input unit 42 of the same heat dissipation device 40. In this embodiment, the circulation direction is such that the thermal conduction medium enters the first main-channel tubes 231 of the condensers 23 through the low-temperature thermal conduction medium output unit 41 (as indicated by the arrows Ad1), then flows from each first main-channel tube 231 through the flat tubes 232 of the corresponding condenser 23 to the corresponding second main-channel tube 233 (as indicated by the arrows Ad2), and eventually returns to the heat dissipation device 40 from the second main-channel tube 233 of each condenser 23 through the high-temperature thermal conduction medium input unit 42 (as indicated by the arrows Ad3).

In another embodiment, the first main-channel tube 231 and the second main-channel tube 233 of each condenser 23 may be connected to a different heat dissipation device 40 in order for each heat dissipation device 40 to dissipate heat from the thermal conduction medium in the corresponding condenser 23 independently, thereby enhancing the efficiency of heat exchange. The present invention has no limitation on whether a plurality of condensers 23 are connected to the same heat dissipation device or each to a different heat dissipation device.

Apart from the foregoing parallel-connected configuration, the internal loop of the front-row and rear-row condensers in another embodiment of the present invention may be series-connected instead. The terms "front-row" and "rear-row" are defined according to the flow direction of the cooling liquid: the condenser that is close to the input portion IP is the front-row condenser while the condenser that is close to the output portion OP is the rear-row condenser. Please refer to FIG. 8, which schematically shows the loop designs of another two condenser embodiments according to the invention. In the embodiment shown in FIG. 8(*a*), the first main-channel tube 231A of the front-row condenser 23A is connected to the second main-channel tube 233B of the rear-row condenser 23B, and in order to ensure that the coolest thermal conduction medium is input into the rear row first, the first main-channel tube 231B of the rear-row condenser 23B (i.e., of the condenser close to the output portion OP) is connected to the low-temperature thermal conduction medium output unit 41 of the heat dissipation device 40. In this embodiment, the circulation direction is such that the thermal conduction medium enters the first main-channel tube 231B of the rear-row condenser 23B through the low-temperature thermal conduction medium output unit 41, then flows from the first main-channel tube 231B of the rear-row condenser 23B through the flat tubes 232B to the second main-channel tube 233B (as indicated by the arrow Ap1), then passes from the second main-channel tube 233B of the rear-row condenser 23B through a connecting pipe F1 to the first main-channel tube 231A of the front-row condenser 23A (as indicated by the arrow Ap2), then flows from the first main-channel tube 231A of the front-row condenser 23A through the flat tubes 232A to the second main-channel tube 233A (as indicated by the arrow Ap3), and eventually returns to the heat-dissipation device 40 from the second main-channel tube 233A of the front-row condenser 23A through the high-temperature thermal conduction medium input unit 42.

Figure 8:
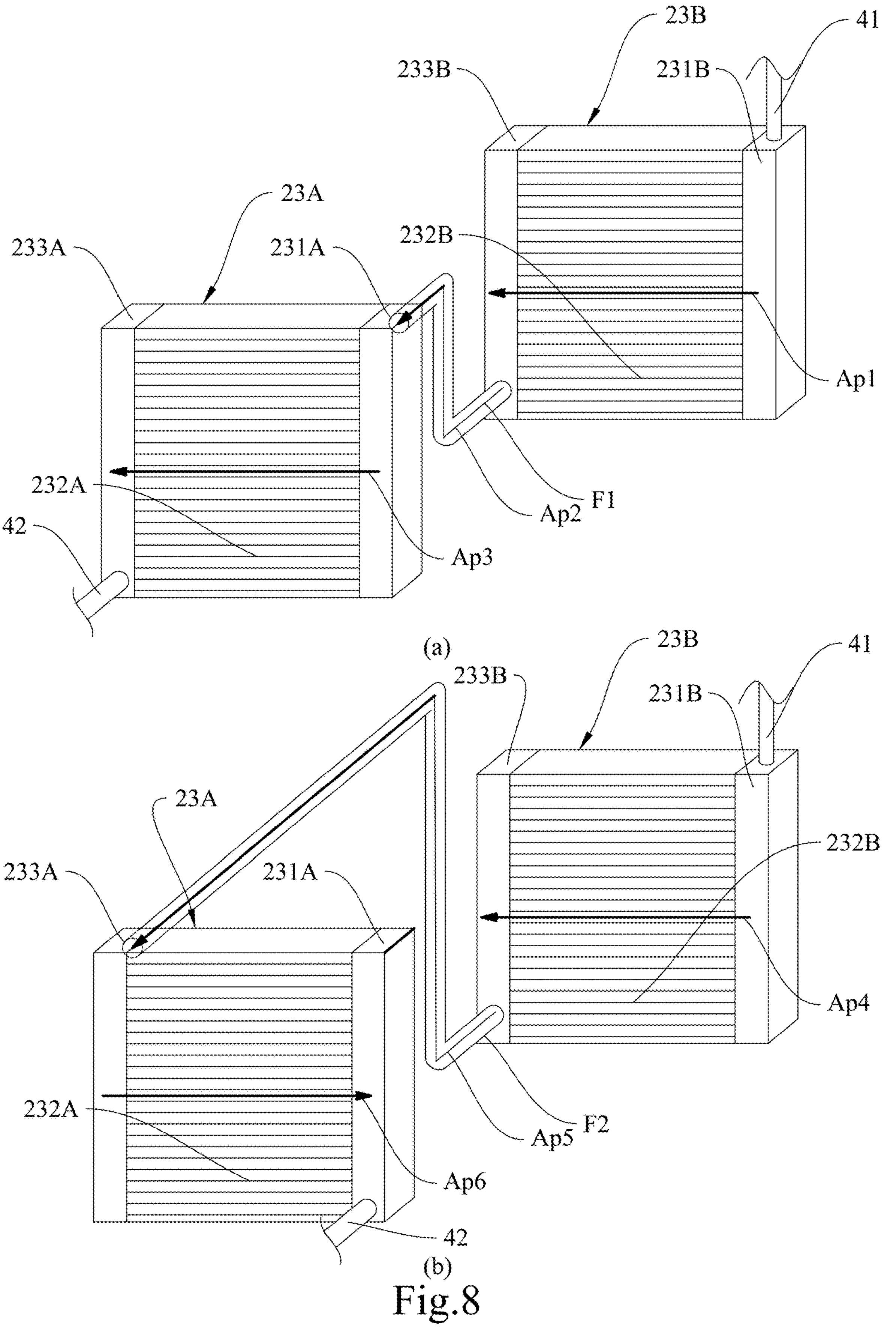
FIG. 8 schematically shows the loop designs of another two condenser embodiments according to the present invention.

In the embodiment shown in FIG. 8(*b*), the second main-channel tube 233A of the front-row condenser 23A is connected to the second main-channel tube 233B of the rear-row condenser 23B, and the first main-channel tube 231B of the rear-row condenser 23B (i.e., of the condenser close to the output portion OP) is connected to the low-temperature thermal conduction medium output unit 41 of the heat dissipation device 40. In this embodiment, the circulation direction is such that the thermal conduction medium enters the first main-channel tube 231B of the rear-row condenser 23B through the low-temperature thermal conduction medium output unit 41, then flows from the first main-channel tube 231B of the rear-row condenser 23B through the flat tubes 232B to the second main-channel tube 233B (as indicated by the arrow Ap4), then passes from the second main-channel tube 233B of the rear-row condenser 23B through a connecting pipe F2 to the second main-channel tube 233A of the front-row condenser 23A (as indicated by the arrow Ap5), then flows from the second main-channel tube 233A of the front-row condenser 23A through the flat tubes 232A to the first main-channel tube 231A (as indicated by the arrow Ap6), and eventually returns to the heat dissipation device 40 from the first main-channel tube 231A of the front-row condenser 23A through the high-temperature thermal conduction medium input unit 42.

Figure 3:
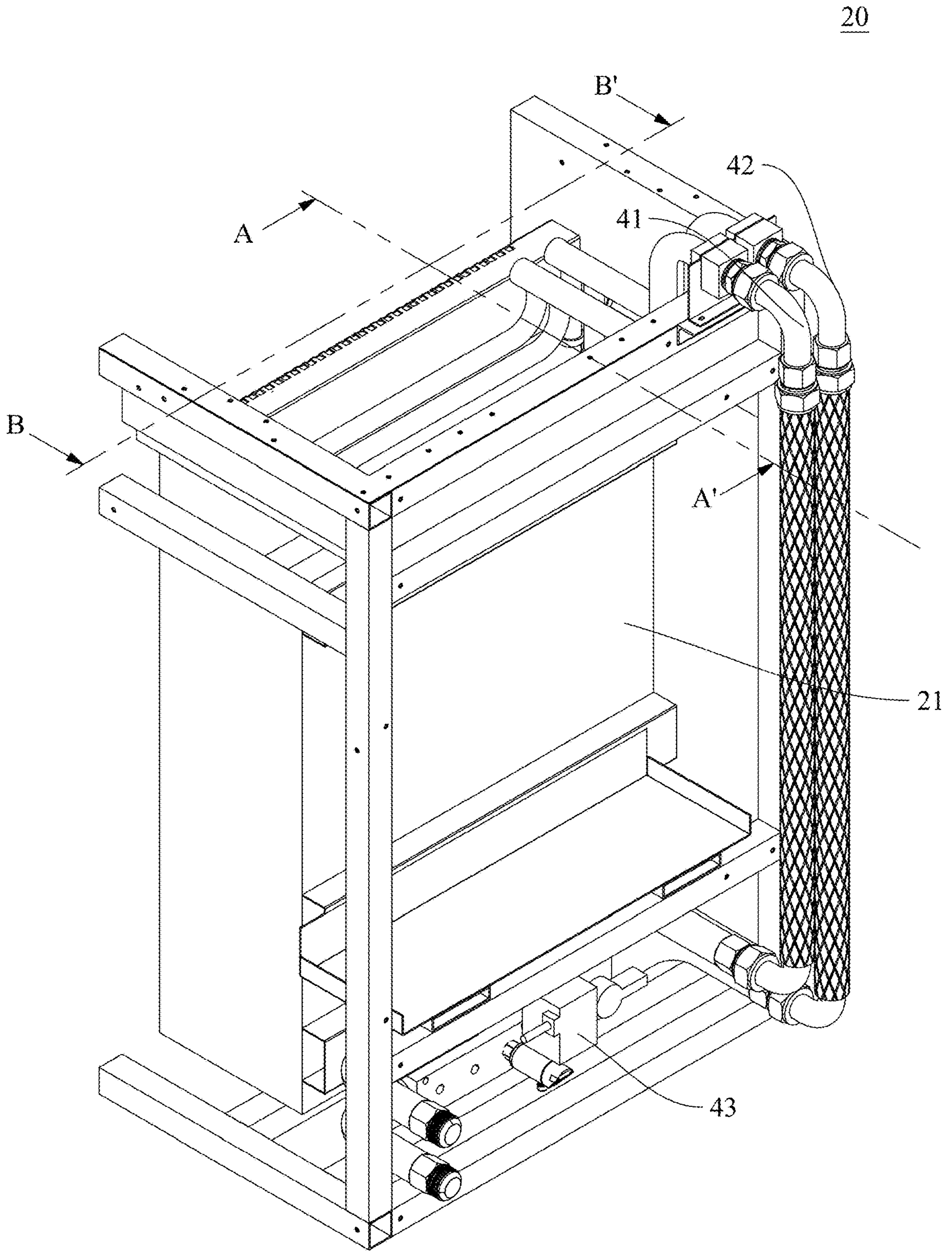
FIG. 3 is a perspective view of heat exchange equipment according to the present invention.
Figure 9:
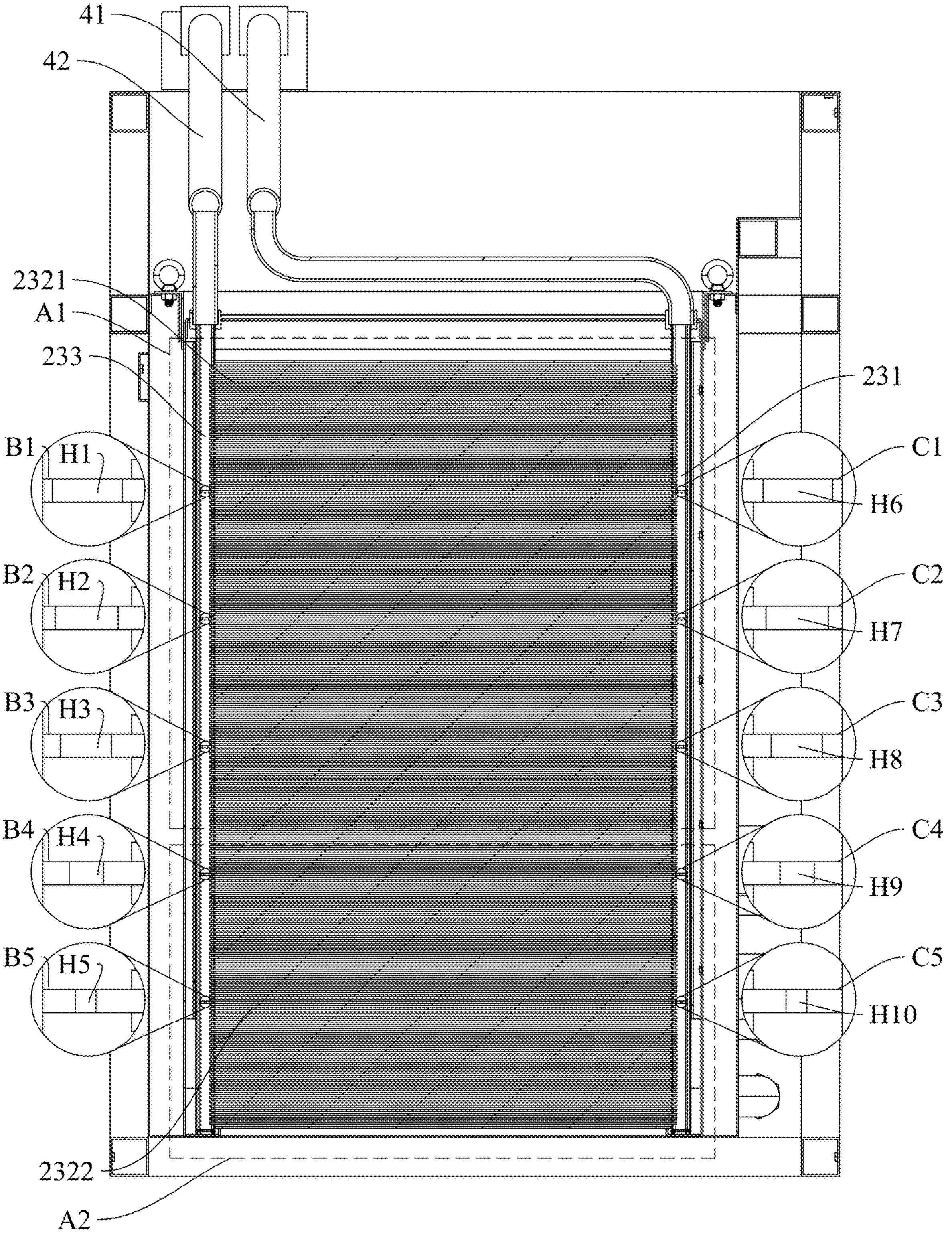
FIG. 9 is a sectional view taken along line BB' in FIG. 3 and corresponding to the second embodiment.

Please refer to FIG. 9 for a sectional view taken along line BB' in FIG. 3 and corresponding to the second embodiment. As shown in FIG. 9, the first main-channel tube 231 is provided therein with a plurality of baffle plates B1-B5 so that the thermal conduction medium flowing in the first main-channel tube 231 will not pass through lower ones of the flat tubes (e.g., the flat tubes 2322 in the area A2) in a concentrated manner due to gravity and hence barely pass through upper ones of the flat tubes (e.g., the flat tubes 2321 in the area A1), which if happening will reduce heat exchange efficiency. The baffle plate B1 is provided with a flow regulation hole H1, the baffle plate B2 is provided with a flow regulation hole H2, the baffle plate B3 is provided with a flow regulation hole H3, the baffle plate B4 is provided with a flow regulation hole H4, and the baffle plate B5 is provided with a flow regulation hole H5, wherein the closer to the bottom side a baffle plate is, the smaller the flow regulation hole in that baffle plate. For example, the flow regulation hole H1 is larger than the flow regulation hole H2, which is larger than the flow regulation hole H3, which is larger than the flow regulation hole H4, which is larger than the flow regulation hole H5. This arrangement of hole sizes contributes to a uniform flow through the different flat tubes 232. In one embodiment, the second main-channel tube 233 may also be provided therein with a plurality of baffle plates C1-C5, with the baffle plate C1 provided with a flow regulation hole H6, the baffle plate C2 provided with a flow regulation hole H7, the baffle plate C3 provided with a flow regulation hole H8, the baffle plate C4 provided with a flow regulation hole H9, and the baffle plate C5 provided with a flow regulation hole H10, wherein the closer to the bottom side a baffle plate is, the smaller the flow regulation hole in that baffle plate. For example, the flow regulation hole H6 is larger than the flow regulation hole H7, which is larger than the flow regulation hole H8, which is larger than the flow regulation hole H9, which is larger than the flow regulation hole H10. This arrangement of hole sizes also contributes to a uniform flow through the different flat tubes 232. It should be pointed out that while both the first main-channel tube 231 and the second main-channel tube 232 in the illustrated embodiment are provided with baffle plates, it is feasible in another embodiment for only the first main-channel tube 231 to be provided therein with baffle plates, or for only the second main-channel tube 232 to be provided therein with baffle plates. The present invention has no limitation on variations such as those of the foregoing embodiments. The invention has no limitation on the number of the baffle plates, either.

In one embodiment, the condenser in the present invention may be provided therein with a separation plate in order to have more loop segments. Please refer to FIG. 10, which schematically shows the loop designs of yet another two condenser embodiments according to the invention. In the embodiment shown in FIG. 10(*a*), the first main-channel tube 231C of the condenser 23C is provided therein with a separation plate S1 in order to create more loop segments. The separation plate S1 divides the first main-channel tube 231C into an upper cavity R1 and a lower cavity R2. The low-temperature thermal conduction medium output unit 41 is connected to the upper cavity R1, and as indicated by the arrow Ar1, the thermal conduction medium enters the upper cavity R1 through the low-temperature thermal conduction medium output unit 41. Next, as indicated by the arrow Ar2, the thermal conduction medium flows from the upper cavity R1 through the upper flat tubes 2321C to the second main-channel tube 233C and then flows downward along the second main-channel tube 233C. After that, as indicated by the arrow Ar3, the thermal conduction medium flows through the lower flat tubes 2322C to the lower cavity R2 of the first main-channel tube 231 and eventually returns to the heat dissipation device 40 from the lower cavity R2 through the high-temperature thermal conduction medium input unit 42.

Figure 10:
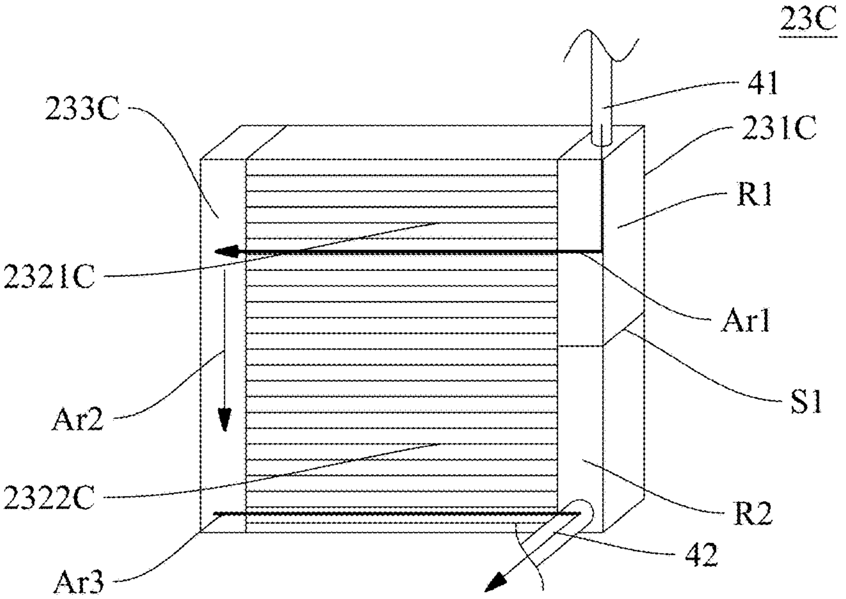
FIG. 10 schematically shows the loop designs of yet another two condenser embodiments according to the present invention.
Figure 10:
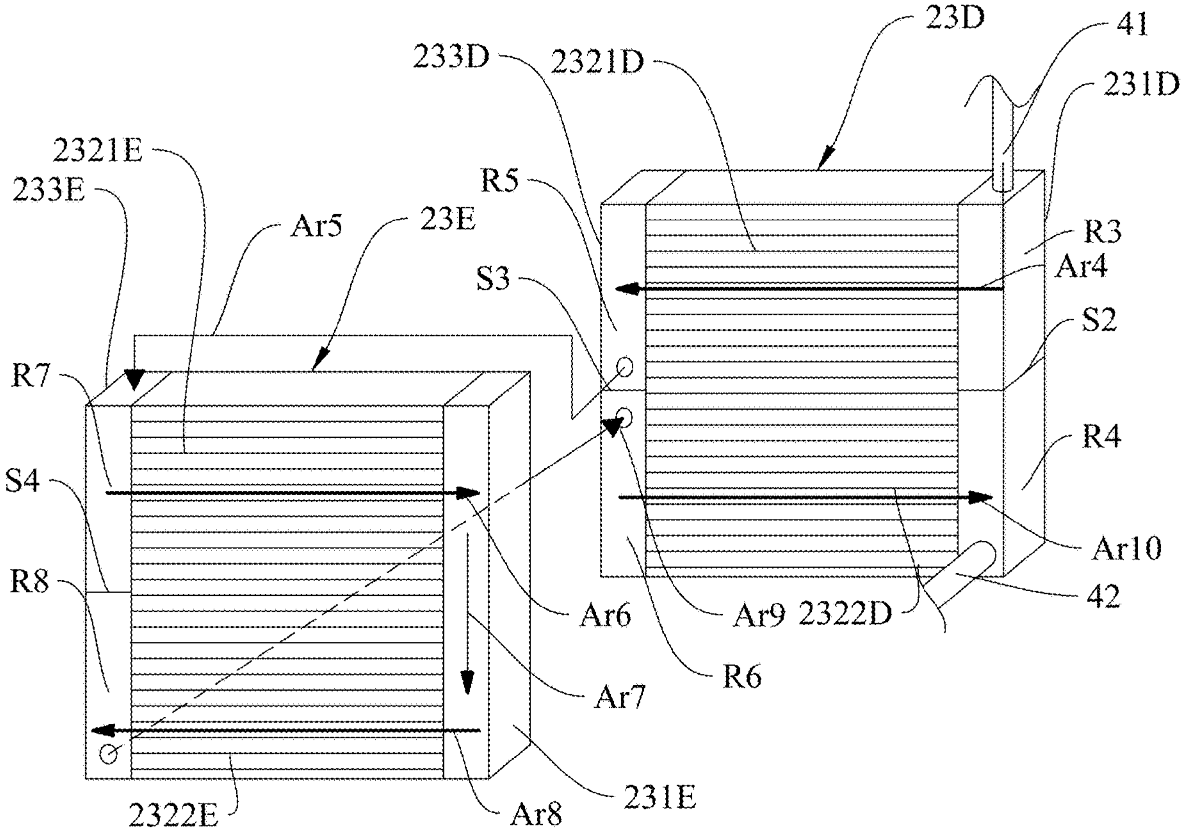

In the embodiment shown in FIG. 10(*b*), the first main-channel tube 231D of the front-row condenser 23D is provided therein with a separation plate S2 for dividing the first main-channel tube 231D into an upper cavity R3 and a lower cavity R4, the second main-channel tube 233D of the front-row condenser 23D is provided therein with a separation plate S3 for dividing the second main-channel tube 233D into an upper cavity R5 and a lower cavity R6, and the second main-channel tube 233E of the rear-row condenser 23E is provided therein with a separation plate S4 for dividing the second main-channel tube 233E into an upper cavity R7 and a lower cavity R8. With the low-temperature thermal conduction medium output unit 41 connected to the upper cavity R3 of the first main-channel tube 231D of the front-row condenser 23D, the resulting circulation loop is as follows. As indicated by the arrow Ar4, the thermal conduction medium enters the upper cavity R3 through the low-temperature thermal conduction medium output unit 41 and then flows from the upper cavity R3 through the upper flat tubes 2321D to the upper cavity R5 of the second main-channel tube 233D. Next, as indicated by the arrow Ar5, the thermal conduction medium having flowed through the upper flat tubes 2321D to the upper cavity R5 of the second main-channel tube 233D passes through the connecting pipe (not shown) between the upper cavity R5 of the second main-channel tube 233D and the upper cavity R7 of the second main-channel tube 233E of the rear-row condenser 23E to the upper cavity R7. After that, as indicated by the arrow Ar6, the thermal conduction medium having flowed through the connecting pipe to the upper cavity R7 flows from the upper cavity R7 through the upper flat tubes 2321E to the first main-channel tube 231E of the rear-row condenser 23E. Then, as indicated by the arrow Ar7, the thermal conduction medium having flowed through the upper flat tubes 2321E to the first main-channel tube 231E is driven downward along the first main-channel tube 231E by either gravity or pressure. Then, as indicated by the arrow Ar8, the thermal conduction medium flows from the first main-channel tube 231E through the lower flat tubes 2322E to the lower cavity R8 of the second main-channel tube 233E. Following that, as indicated by the arrow Ar9, the thermal conduction medium having flowed through the lower flat tubes 2322E to the lower cavity R8 of the second main-channel tube 233E flows through the connecting pipe (not shown) between the lower cavity R8 of the second main-channel tube 233E and the lower cavity R6 of the second main-channel tube 233D of the front-row condenser 23D to the lower cavity R6. Then, as indicated by the arrow Ar10, the thermal conduction medium having flowed through the second connecting pipe to the lower cavity R6 flows from the lower cavity R6 through the lower flat tubes 2322D to the lower cavity R4 of the first main-channel tube 231D of the front-row condenser 23D, before returning to the heat dissipation device 40 from the lower cavity R4 through the high-temperature thermal conduction medium input unit 42.

Aside from the above embodiments, it is feasible to further increase the number of the condensers (e.g., to more than two condensers) and to increase the number of loop segments or the route length by adding more separation plates. The present invention has no limitation on variations such as those of the foregoing embodiments.

Figure 11:
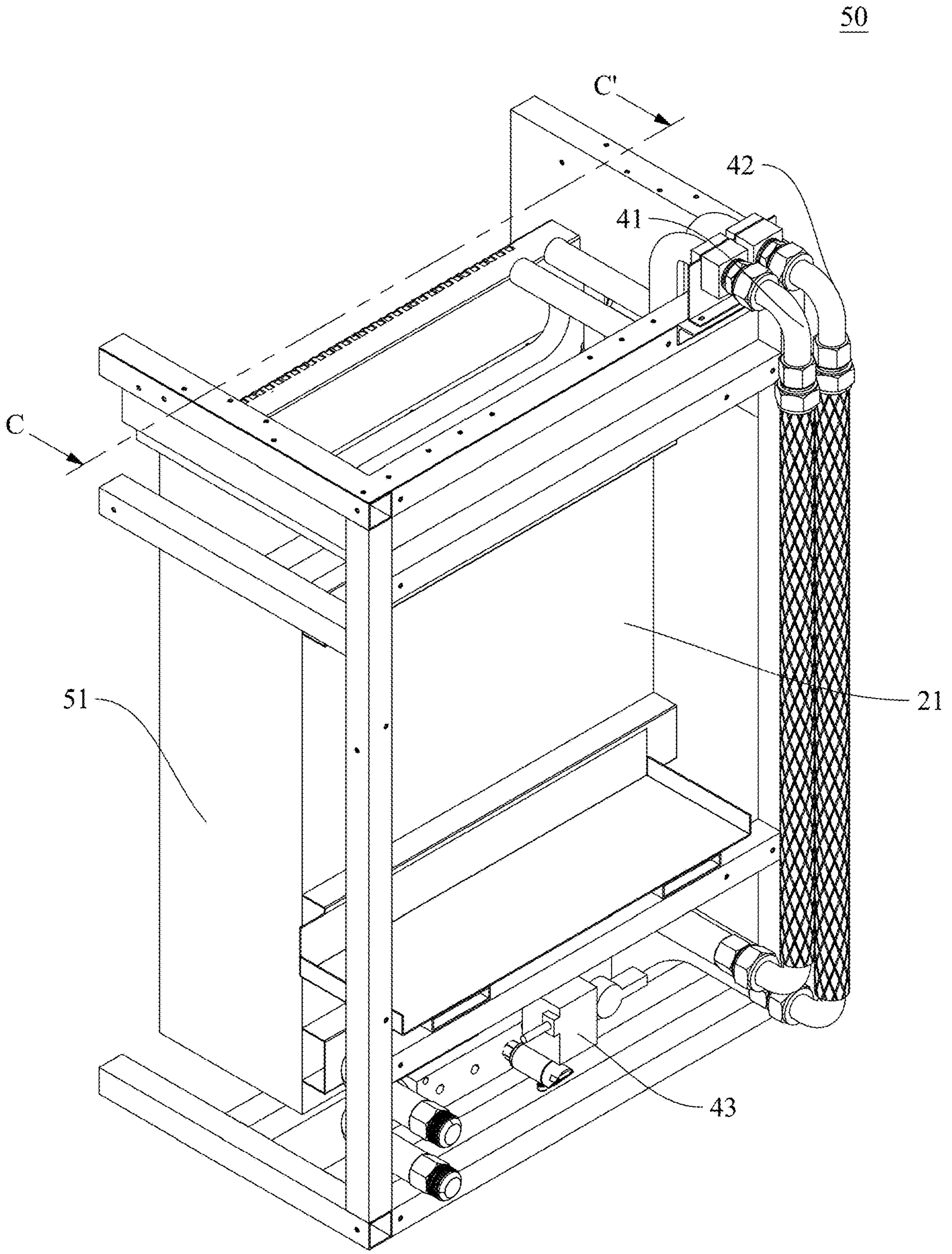
FIG. 11 is a perspective view of another heat exchange equipment embodiment according to the present invention.
Figure 12:
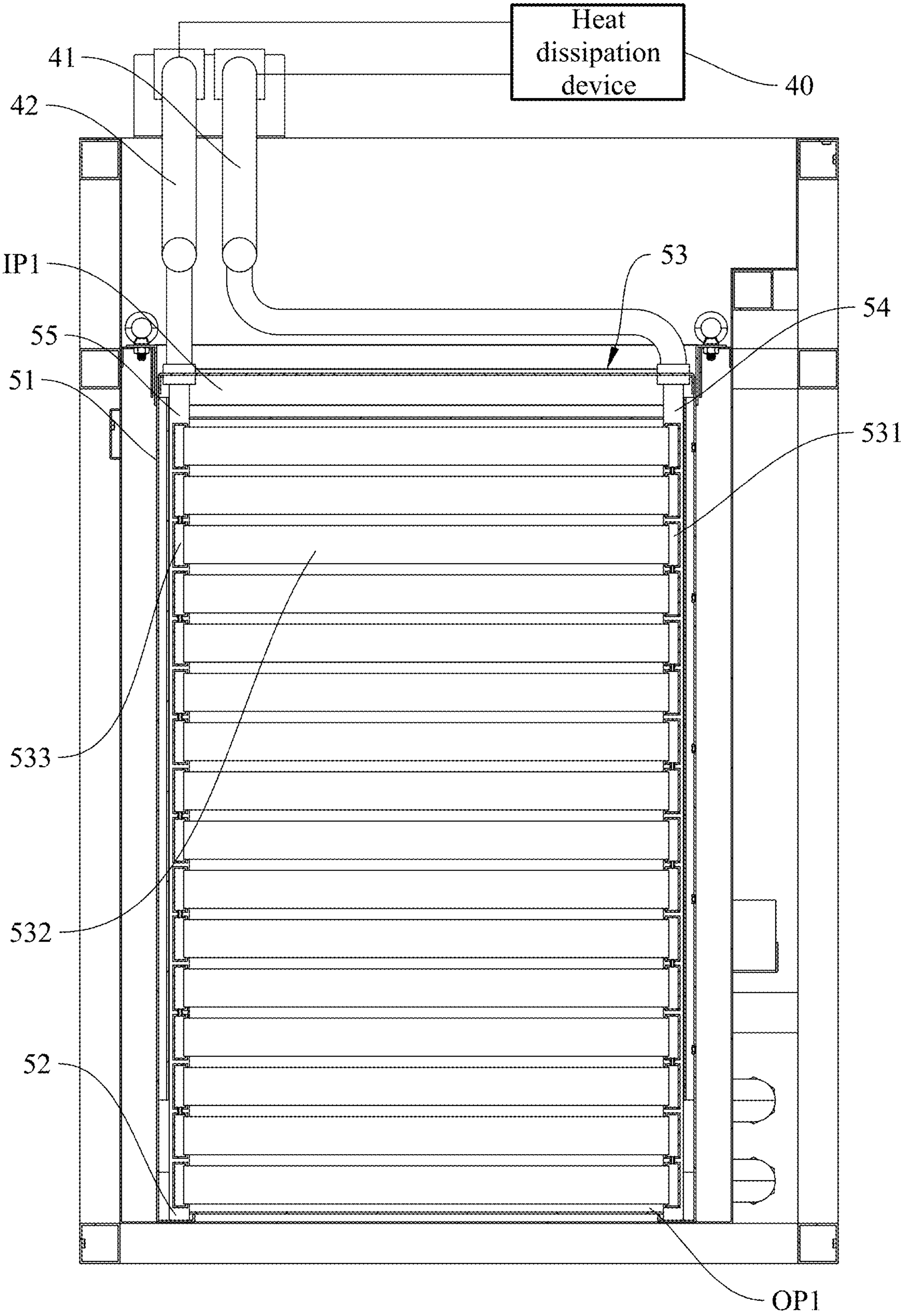
FIG. 12 is a sectional view taken along line CC' in FIG. 11.

Another embodiment of the heat exchange equipment in the present invention is described below with reference to FIG. 11 and FIG. 12, which are a perspective view of another heat exchange equipment embodiment according to the invention and a sectional view taken along line CC' in FIG. 11, respectively. In the embodiment shown in FIG. 11 and FIG. 12, the heat exchange equipment 50 includes a secondary container 51 and at least one heat exchange tank 52 provided in the secondary container 51. The heat exchange tank 52 is provided therein with a plurality of condensers 53 that divide the heat exchange tank 52 into an input portion IP1 and an output portion OP1. In this embodiment, the input portion IP1 faces upward, the output portion OP1 faces downward, and the condensers 53 are sequentially arranged from top to bottom so that the cooling liquid can pass through the condensers 53 due to gravity and has its temperature lowered as a result.

Each condenser 53 includes a first main-channel tube 531 and a second main-channel tube 533, each located on one of two opposite lateral sides of the condenser 53, plus a plurality of flat tubes 532 provided between the first main-channel tube 531 and the second main-channel tube 533. In this embodiment, the gap between each two adjacent flat tubes 532 (i.e., a channel through which the cooling liquid can pass) has one end opening facing upward (i.e., facing the input portion IP1) and the other end opening facing downward (i.e., facing the output portion OP1) to allow the cooling liquid to flow between the flat tubes 532. The cooling liquid having entered the heat exchange tank 52 exchanges heat with the thermal conduction medium in the flat tubes 532 through the flat tubes 532 and is thus cooled by the thermal conduction medium. The condensers 53 are further connected to a heat dissipation device 40.

Figure 13:
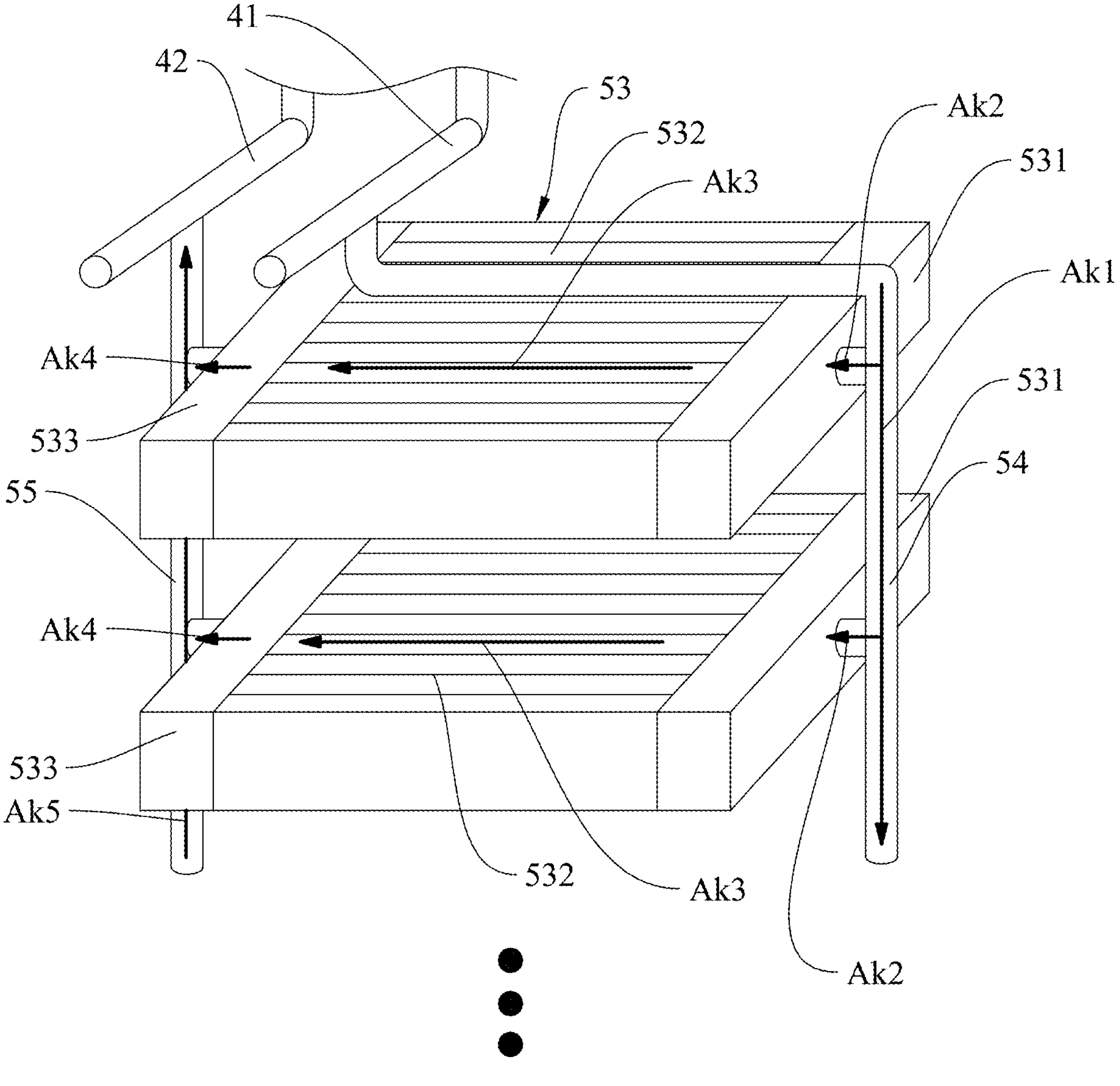
FIG. 13 schematically shows the loop design of the parallel-connected condensers in another embodiment of the present invention.

The loop design of this embodiment is described below with reference to FIG. 13, which schematically shows the loop design of the parallel-connected condensers in this embodiment. As shown in the drawing, the first main-channel tubes 531 of the condensers 53 are connected to a first main duct 54, and the first main duct 54 is connected to the low-temperature thermal conduction medium output unit 41. In addition, the second main-channel tubes 533 of the condensers 53 are connected to a second main duct 55, and the second main duct 55 is connected to the high-temperature thermal conduction medium input unit 42. The circulation direction in this embodiment is as follows. The thermal conduction medium enters the first main duct 54 through the low-temperature thermal conduction medium output unit 41 (as indicated by the arrow Ak1). Then, the thermal conduction medium having entered the first main duct 54 enters the first main-channel tube 531 of the condenser 53 in each tier through a corresponding connecting pipe in the tier (as indicated by the arrows Ak2). After that, the thermal conduction medium flows from the first main-channel tube 531 of the condenser 53 in each tier through the flat tubes 532 of the condenser 53 in the tier to the second main-channel tube 533 of the condenser 53 in the tier (as indicated by the arrows Ak3). Next, the thermal conduction medium flows from the second main-channel tube 533 of the condenser 53 in each tier through a corresponding connecting pipe to the second main duct 55 (as indicated by the arrows Ak4). Lastly, the thermal conduction medium gathering in the second main duct 55 returns to the heat dissipation device 40 through the high-temperature thermal conduction medium input unit 42 (as indicated by the arrow Ak5).

In this embodiment, there are a total of 16 condensers 53 sequentially arranged in the top-to-bottom direction; the present invention, however, has no limitation on the number of the condensers 53.

Apart from the foregoing parallel-connected configuration, the internal loop of the vertically adjacent condensers in another embodiment may be series-connected instead (analogous to the embodiments shown in FIG. 8), as described below with reference to FIG. 14, which schematically shows the loop designs of the series-connected condensers in another two embodiments of the present invention. In the embodiments shown in FIG. 14, the low-temperature thermal conduction medium output unit 41 is connected to the condenser in the top tier while the high-temperature thermal conduction medium input unit 42 is connected to the condenser in the bottom tier. In the embodiment shown in FIG. 14(*a*), the thermal conduction medium flows from the first main-channel tube 531A of the first-tier condenser 53A through the flat tubes 532A to the second main-channel tube 533A (as indicated by the arrow Au1), then flows to the second main-channel tube 533B of the second-tier condenser 53B through the connecting pipe CP1 between the second main-channel tube 533A of the first-tier condenser 53A and the second main-channel tube 533B of the second-tier condenser 53B (as indicated by the arrow Au2), then flows from the second main-channel tube 533B of the second-tier condenser 53B through the flat tubes 532B to the first main-channel tube 531B (as indicated by the arrow Au3), then flows to the first main-channel tube 531C of the third-tier condenser 53C through the connecting pipe CP2 between the first main-channel tube 531B of the second-tier condenser 53B and the first main-channel tube 531C of the third-tier condenser 53C (as indicated by the arrow Au4), then flows from the first main-channel tube 531C of the third-tier condenser 53C through the flat tubes 532C to the second main-channel tube 533C (as indicated by the arrow Au5), and so on. The aforesaid S-shaped flow path allows the thermal conduction medium to flow sequentially downward through the flat tubes of a plurality of condensers along a single route and return to the heat dissipation device 40 through the high-temperature thermal conduction medium input unit 42 connected to the bottom-tier condenser, thereby completing one circulation.

Figure 14:
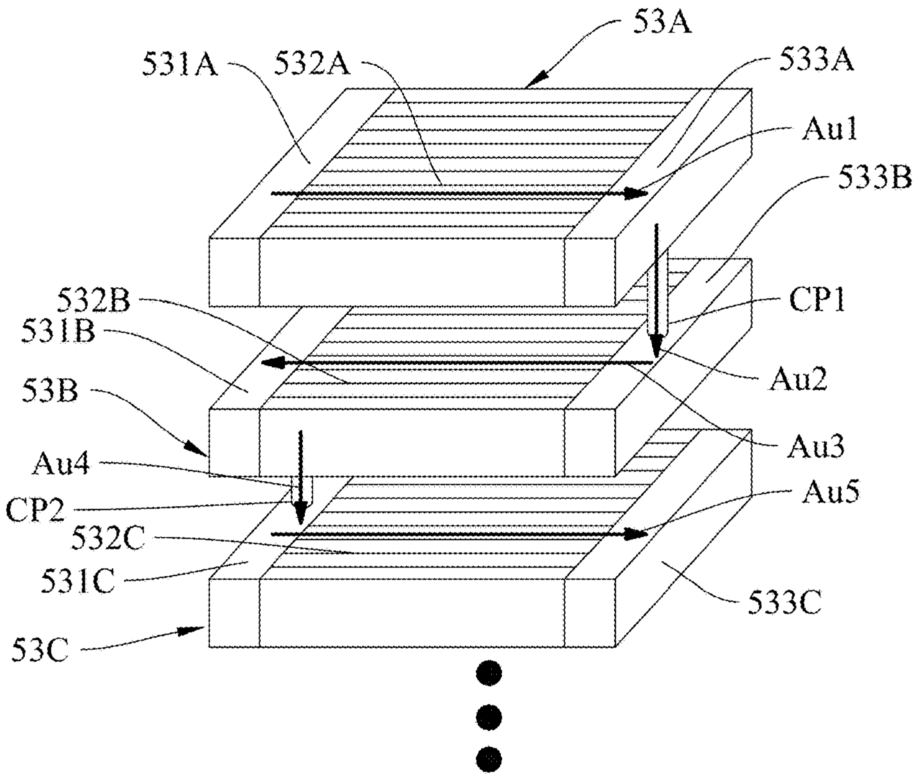
FIG. 14 schematically shows the loop designs of the series-connected condensers in another two embodiments of the present invention.
Figure 14:
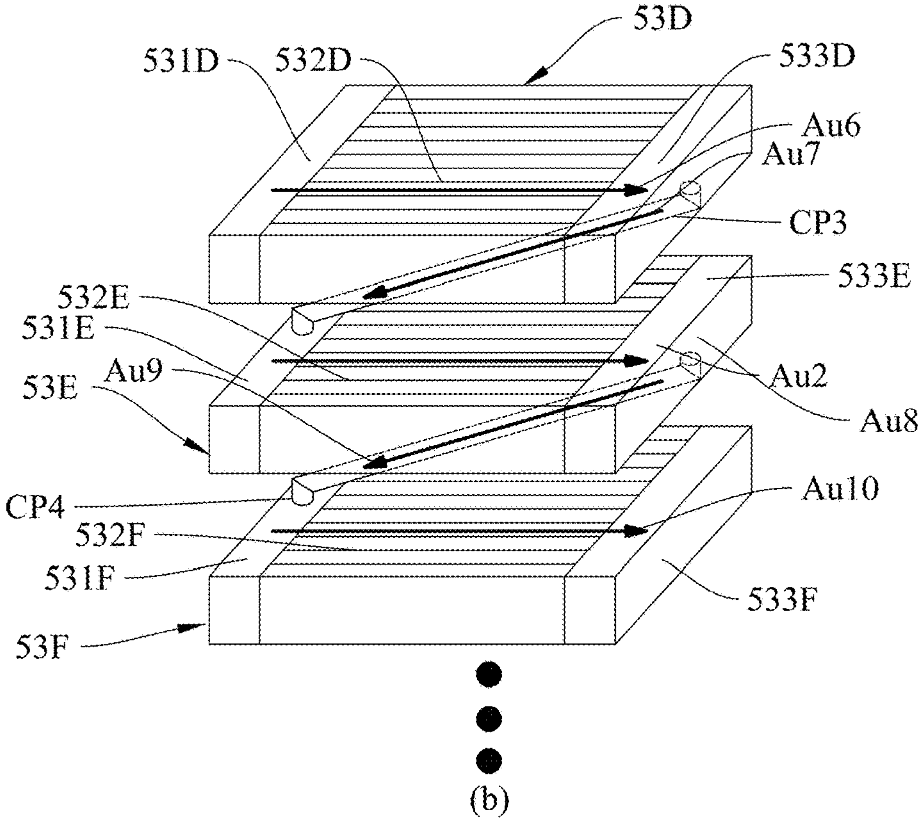

In the embodiment shown in FIG. 14(*b*), the thermal conduction medium flows from the first main-channel tube 531D of the first-tier condenser 53D through the flat tubes 532D to the second main-channel tube 533D (as indicated by the arrow Au6), then flows to the first main-channel tube 531E of the second-tier condenser 53E through the connecting pipe CP3 between the second main-channel tube 533D of the first-tier condenser 53D and the first main-channel tube 531E of the second-tier condenser 53E (as indicated by the arrow Au7), then flows from the first main-channel tube 531E of the second-tier condenser 53E through the flat tubes 532E to the second main-channel tube 533E (as indicated by the arrow Au8), then flows to the first main-channel tube 531F of the third-tier condenser 53F through the connecting pipe CP4 between the second main-channel tube 533E of the second-tier condenser 53E and the first main-channel tube 531F of the third-tier condenser 53F (as indicated by the arrow Au9), then flows from the first main-channel tube 531F of the third-tier condenser 53F through the flat tubes 532F to the second main-channel tube 533F (as indicated by the arrow Au10), and so on. The aforesaid Z-shaped flow path allows the thermal conduction medium to flow sequentially downward through the flat tubes of a plurality of condensers along a single route and return to the heat dissipation device 40 through the high-temperature thermal conduction medium input unit 42 connected to the bottom-tier condenser, thereby completing one circulation.

Figure 15:
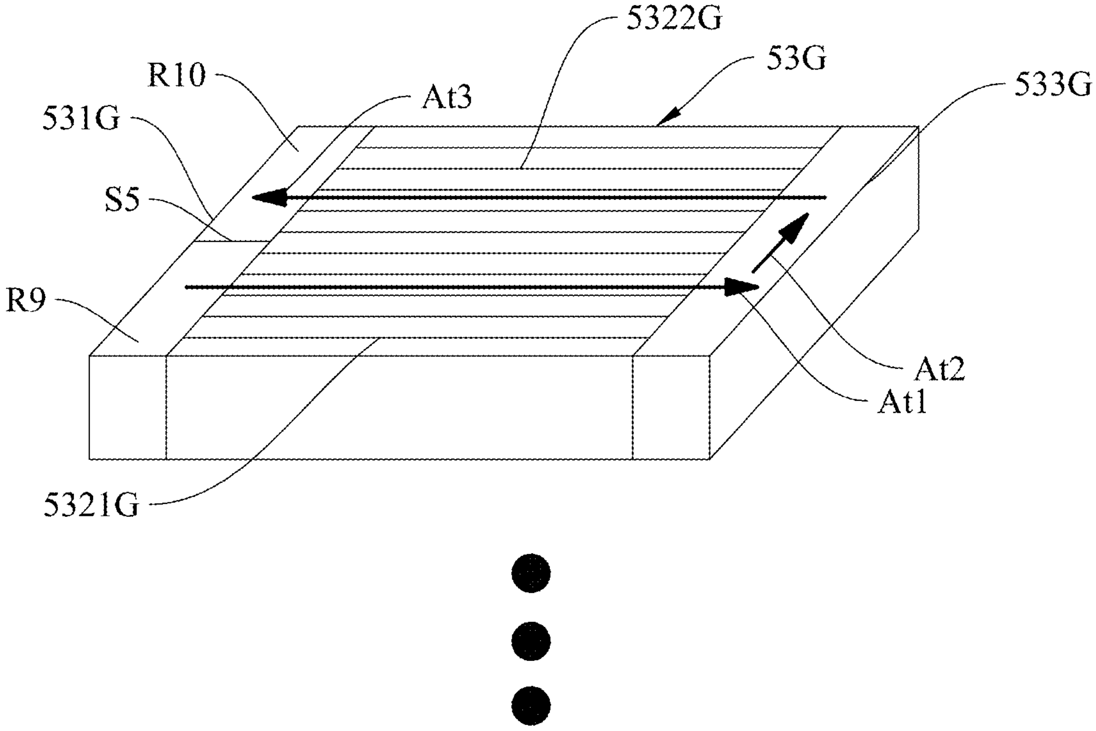
FIG. 15 schematically shows the loop design of the series-connected condensers in yet another embodiment of the present invention.

In another embodiment, the first main-channel tube and the second main-channel tube of each condenser may be provided therein with a separation plate (analogous to the embodiments shown in FIG. 10) in order for the separation plate to increase the number of loop segments or the route length and thereby enhance the efficiency of heat exchange. Please refer to FIG. 15, which schematically shows the loop design of the series-connected condensers in yet another embodiment of the present invention. As shown in the drawing, the first main-channel tube 531G of the first-tier condenser 53G is provided with a separation plate S5 for dividing the first main-channel tube 531G into a front cavity R9 and a rear cavity R10. The thermal conduction medium flows from the front cavity R9 of the first main-channel tube 531G through the front flat tubes 5321G to a front portion of the second main-channel tube 533G (as indicated by the arrow At1), then flows from the front portion of the second main-channel tube 533G to a rear portion of the second main-channel tube 533G (as indicated by the arrow At2), and then flows from the rear portion of the second main-channel tube 533G through the rear flat tubes 5322G to the rear cavity R10 of the first main-channel tube 531G (as indicated by the arrow At3), thereby completing the circulation in one tier. In this embodiment where there are a plurality of tiers of condensers (represented by the vertical row of dots), an upper-tier condenser may be connected to the immediate lower-tier condenser through a connecting pipe to series-connect the loops in the upper and lower tiers, thereby allowing the thermal conduction medium to return to the heat dissipation device 40 through the high-temperature thermal conduction medium input unit 42 connected to the bottom-tier condenser and thus complete one full circulation.

Figure 16:
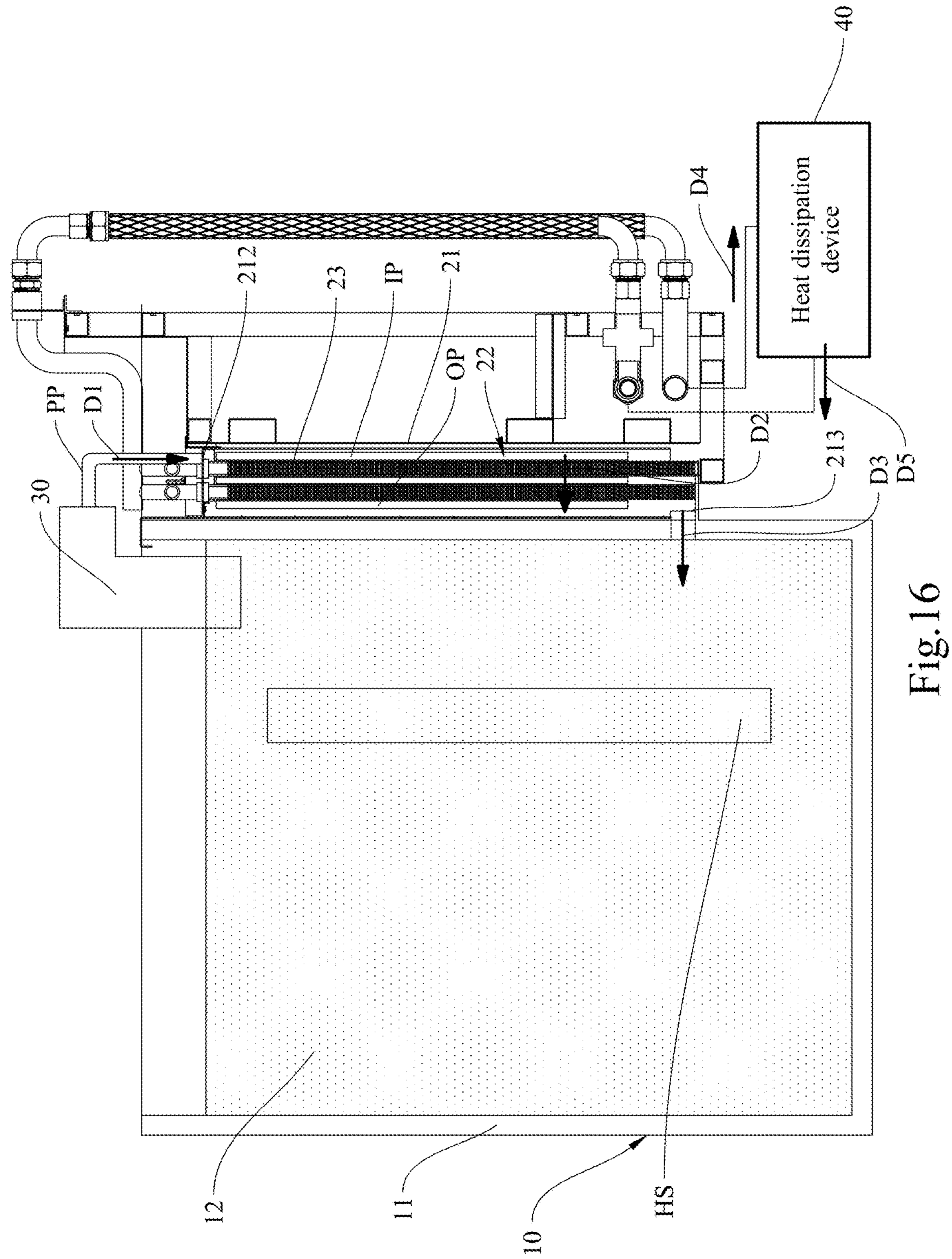
FIG. 16 schematically shows the cooling liquid circulation in an immersion heat exchange system according to the present invention.

The circulation process is now described with reference to FIG. 16, which schematically shows the cooling liquid circulation in an immersion heat exchange system according to the present invention. To begin with, the cooling liquid in the cooling tank 12 passes by/through, and receives heat from, the active heat source device HS to lower the temperature of the active heat source device HS. After the cooling liquid receives the heat, the temperature of the cooling liquid is increased. The cooling liquid is then delivered from the cooling tank 12 to the heat exchange equipment 20 through the circulation device 30. The cooling liquid enters the input portion IP of the heat exchange tank 22 through the collection opening 212 on the upper side of the secondary container 21 (as indicated by the arrow D1). The high-temperature cooling liquid having entered the input portion IP of the heat exchange tank 22 passes through the two condensers 23, exchanges heat with the thermal conduction medium in the condensers 23 (as indicated by the arrow D2), and returns to the cooling tank 12 through the communication opening 213 on the lower side of the secondary container 21 (as indicated by the arrow D3) to complete one circulation of the cooling liquid. Meanwhile, the heated thermal conduction medium in the condensers 23 is delivered to the heat dissipation device 40 in order to be cooled (as indicated by the arrow D4), and the thermal conduction medium from which heat has been dissipated is delivered from the heat dissipation device 40 back to the condensers 23 (as indicated by the arrow D5) to complete one circulation of the thermal conduction medium. The foregoing process provides continuous removal of the heat generated by the active heat source device HS.

In summary, the present invention uses a condenser to cool a cooling liquid directly, lest the high viscosity coefficient of the cooling liquid cause a loss in heat exchange efficiency. The invention has such advantages over the prior art as high efficiency, high fault tolerance, and ease of maintenance.

The above is the detailed description of the present invention. However, the above is merely the preferred embodiment of the present invention and cannot be the limitation to the implement scope of the invention, which means the variation and modification according to the present invention may still fall into the scope of the present invention.

What is claimed is:

1. An immersion heat exchange system, comprising:

a cooling equipment comprising a primary container and at least one cooling tank provided in the primary container, the cooling tank holding a cooling liquid in order for an active heat source device to be immersed in the cooling liquid; and a heat exchange equipment connected to the cooling equipment, which comprises a secondary container and at least one heat exchange tank provided in the secondary container, wherein the heat exchange tank is provided therein with at least one condenser, which divides the heat exchange tank into an input portion and an output portion, with at least one circulation device corresponding to and working with the input portion and/or the output portion of the heat exchange tank, wherein the condenser comprises a first main-channel tube connected to a heat dissipation device, a plurality of flat tubes each having one end connected to the first main-channel tube to allow passage of a thermal conduction medium, and a second main-channel tube connected to an opposite end of each of the flat tubes, and the second main-channel tube is connected to the heat dissipation device, wherein the secondary container comprises a separation plate covering the condenser from above, the separation plate is provided with at least one through hole to enable connection with at least one pipe of the circulation device, and the through hole is aligned with a side of the condenser that faces the input portion, and wherein the circulation device draws the cooling liquid in the cooling tank and delivers the drawn cooling liquid into the input portion of the heat exchange tank through the through hole directly by way of the pipe connected to the through hole, and the output portion of the heat exchange tank is in communication with the cooling tank to enable circulation.

2. The immersion heat exchange system of claim 1, wherein the secondary container comprises: a secondary container body having the heat exchange tank, a collection opening provided on an upper side of the secondary container body, and a communication opening provided on a lower side of the secondary container body and communicating with the cooling tank.

3. The immersion heat exchange system of claim 2, wherein the collection opening is provided therein with the separation plate.

4. The immersion heat exchange system of claim 1, wherein there are a plurality of said condensers, and the condensers are connected in series.

5. The immersion heat exchange system of claim 4, wherein the first main-channel tube of each of the condensers is connected to the same heat dissipation device, and the second main-channel tube of each of the condensers is connected to the same heat dissipation device.

6. The immersion heat exchange system of claim 4, wherein the first main-channel tube of at least one of the condensers is connected to the second main-channel tube of another said condenser.

7. The immersion heat exchange system of claim 4, wherein the second main-channel tube of at least one of the condensers is connected to the second main-channel tube of another said condenser.

8. The immersion heat exchange system of claim 6, wherein the first main-channel tube of one of the condensers adjacent to the output portion is connected to the heat dissipation device.

9. The immersion heat exchange system of claim 1, wherein a booster pump is provided between the condenser and the heat dissipation device, and the booster pump forces the thermal conduction medium into the tubes of the condenser to enable circulation.

10. The immersion heat exchange system of claim 1, wherein the circulation device is a pump for drawing the cooling liquid in the cooling tank to the heat exchange tank.

* * * * *